United States Patent
Terada et al.

(10) Patent No.: US 12,469,685 B2
(45) Date of Patent: Nov. 11, 2025

(54) SURFACE MODIFYING APPARATUS AND BONDING STRENGTH DETERMINATION METHOD

(71) Applicant: Tokyo Electron Limited, Tokyo (JP)

(72) Inventors: Takashi Terada, Koshi (JP); Yuji Mimura, Koshi (JP); Hiroshi Maeda, Koshi (JP); Takuro Masuzumi, Koshi (JP); Masaru Honda, Koshi (JP); Ryoichi Sakamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 183 days.

(21) Appl. No.: 18/262,444

(22) PCT Filed: Jan. 19, 2022

(86) PCT No.: PCT/JP2022/001712
§ 371 (c)(1),
(2) Date: Jul. 21, 2023

(87) PCT Pub. No.: WO2022/158471
PCT Pub. Date: Jul. 28, 2022

(65) Prior Publication Data
US 2024/0079222 A1    Mar. 7, 2024

(30) Foreign Application Priority Data
Jan. 25, 2021 (JP) ................... 2021-009777

(51) Int. Cl.
*H01J 37/32* (2006.01)
*G01N 21/71* (2006.01)
(Continued)

(52) U.S. Cl.
CPC ...... *H01J 37/32917* (2013.01); *G01N 21/718* (2013.01); *H01J 49/42* (2013.01);
(Continued)

(58) Field of Classification Search
CPC ............... H01J 32/32917; H01J 49/42; H01J 2237/24571; H01J 2237/336;
(Continued)

(56) References Cited

U.S. PATENT DOCUMENTS

2004/0171231 A1* 9/2004 Yanagita ........... H01L 21/76259
438/455
2023/0136771 A1   5/2023 Yamauchi et al.

FOREIGN PATENT DOCUMENTS

JP    H07-226350 A    8/1995
JP    2004-266071 A   9/2004
(Continued)

OTHER PUBLICATIONS

International Search Report for PCT/JP2022/001712 dated Apr. 19, 2022.

*Primary Examiner* — George R Koch
(74) *Attorney, Agent, or Firm* — Chrisman Gallo Tochtrop LLC

(57) ABSTRACT

A surface modifying apparatus is configured to modify a bonding surface of a substrate to be bonded to another substrate by plasma of a processing gas. The surface modifying apparatus includes a processing vessel; a measuring unit; and a controller. The processing vessel is configured to accommodate the substrate therein. The measuring unit is configured to measure a value indicating an amount of moisture in the processing vessel. The controller is configured to determine whether or not bonding strength between the substrate and the another substrate, when it is assumed that the substrate modified in the processing vessel is bonded to the another substrate, is good based on the value indicating the amount of moisture in the processing vessel measured by the measuring unit.

7 Claims, 8 Drawing Sheets

(51) Int. Cl.
  *H01J 49/42* (2006.01)
  *H01L 21/67* (2006.01)
  *H01L 23/00* (2006.01)

(52) U.S. Cl.
  CPC .............. *H01L 21/67092* (2013.01); *H01J 2237/24571* (2013.01); *H01J 2237/336* (2013.01); *H01L 24/80* (2013.01); *H01L 2224/8001* (2013.01); *H01L 2224/80201* (2013.01)

(58) Field of Classification Search
  CPC . G01N 21/178; H01L 21/67092; H01L 24/80; H01L 2224/8001; H01L 2224/80201
  See application file for complete search history.

(56) References Cited

FOREIGN PATENT DOCUMENTS

| | | |
|---|---|---|
| JP | 2012-049267 A | 3/2012 |
| WO | 2018/084285 A1 | 5/2018 |

* cited by examiner

SURFACE MODIFYING APPARATUS AND BONDING STRENGTH DETERMINATION METHOD

CROSS-REFERENCE TO RELATED APPLICATIONS

This Application is a U.S. national phase application under 35 U.S.C. § 371 of PCT Application No. PCT/JP2022/001712 filed on Jan. 19, 2022, which claims the benefit of Japanese Patent Application No. 2021-009777 filed on Jan. 25, 2021, the entire disclosures of which are incorporated herein by reference.

TECHNICAL FIELD

The various aspects and embodiments described herein pertain generally to a surface modifying apparatus and a bonding strength determination method.

BACKGROUND

Conventionally, as a way to bond substrates such as semiconductor wafers, there is known a method in which bonding target surfaces of the substrates are modified, the modified surfaces of the substrates are hydrophilized, and the hydrophilized substrates are bonded by a Van der Waals force and a hydrogen bond (intermolecular force).

The surface modification of the substrate is performed by using a surface modifying apparatus. The surface modifying apparatus accommodates the substrate in a processing vessel and modifies the surface of the accommodated substrate with plasma of a processing gas.

Patent Document 1: International Publication No. 2018/084285

SUMMARY

In an exemplary embodiment, a surface modifying apparatus is configured to modify a bonding surface of a substrate to be bonded to another substrate by plasma of a processing gas. The surface modifying apparatus includes a processing vessel; a measuring unit; and a controller. The processing vessel is configured to accommodate the substrate therein. The measuring unit is configured to measure a value indicating an amount of moisture in the processing vessel. The controller is configured to determine whether or not bonding strength between the substrate and the another substrate, when it is assumed that the substrate modified in the processing vessel is bonded to the another substrate, is good based on the value indicating the amount of moisture in the processing vessel measured by the measuring unit.

DETAILED DESCRIPTION

Hereinafter, various exemplary embodiments will be described in detail with reference to the accompanying drawings. Further, it should be noted that the present disclosure is not limited to the exemplary embodiments to be described below.

When surface modification of substrates is repeatedly performed in a processing vessel of a surface modifying apparatus, the amount of moisture in the processing vessel gradually decreases due to vacuum-evacuation or the like. If the amount of moisture in the processing vessel decreases, the modification of the surfaces of the substrates may not be sufficiently performed because a state of plasma of a processing gas generated in the processing vessel changes. As a result, bonding strength between the substrates obtained when the modified substrate is bonded to another substrate may decrease. Such a decrease in the bonding strength is undesirable because it causes problems such as delamination of the substrate or the like.

The quality of the bonding strength is generally determined by using an inspection device or the like after the bonding between the substrates is performed. However, this method of investigating the quality of the bonding strength after the bonding between the substrates is performed is not efficient from the viewpoint of improving productivity. In this regard, there is a demand for a technique capable of determining whether or not the quality of the bonding strength between the substrates to be bonded is good before the substrates are bonded.

<Configuration of Bonding System>

Figure 1:
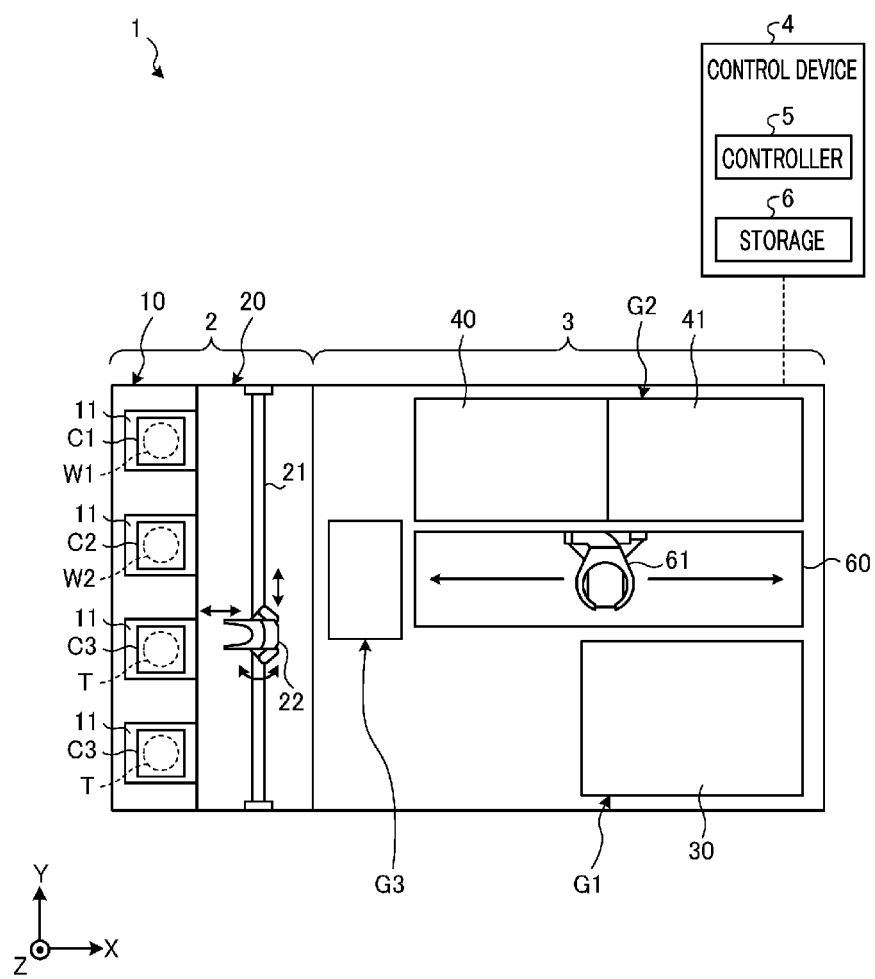
FIG. 1 is a schematic plan view illustrating a configuration of a bonding system according to an exemplary embodiment.
Figure 2:
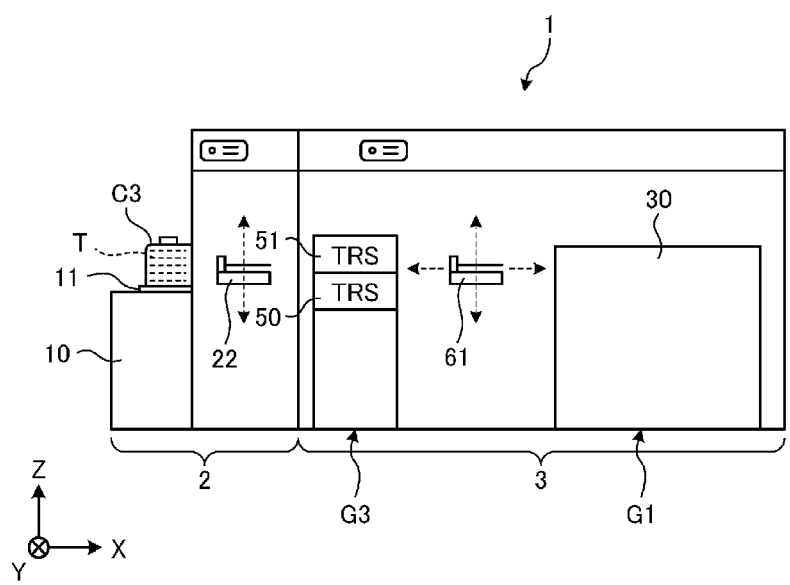
FIG. 2 is a schematic side view illustrating the configuration of the bonding system according to the exemplary embodiment.
Figure 3:
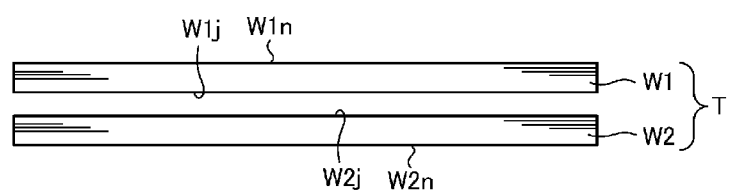
FIG. 3 is a schematic side view of an upper wafer and a lower wafer according to the exemplary embodiment.

First, a configuration of a bonding system 1 according to an exemplary embodiment will be explained with reference to FIG. 1 to FIG. 3. FIG. 1 is a schematic plan view illustrating the configuration of the bonding system 1 according to the exemplary embodiment, and FIG. 2 is a schematic side view of the same. Further, FIG. 3 is a schematic side view of an upper wafer W1 and a lower wafer W2 according to the exemplary embodiment. In the various drawings referred to below, for the sake of easy understanding of the description, an orthogonal coordinate system in which the positive Z-axis direction is defined as a vertically upward direction may sometimes be used.

The bonding system 1 shown in FIG. 1 is configured to form a combined wafer T by bonding a first substrate W1 and a second substrate W2.

The first substrate W1 is a substrate on which a plurality of electronic circuits is formed on a semiconductor substrate such as a silicon wafer or a compound semiconductor wafer. The second substrate W2 is, for example, a bare wafer having no electronic circuit formed thereon. The first substrate W1 and the second substrate W2 have approximately the same diameter. Further, an electronic circuit may be formed on the second substrate W2.

Hereinafter, the first substrate W1 will be referred to as "upper wafer W1", and the second substrate W2 will be referred to as "lower wafer W2". That is, the upper wafer W1 is an example of a first substrate, and the lower wafer W2 is an example of a second substrate. Also, the upper wafer W1 and the lower wafer W2 together may be referred to as "wafer W".

Further, in the following description, as shown in FIG. 3, among plate surfaces of the upper wafer W1, the plate surface to be bonded to the lower wafer W2 will be referred to as "bonding surface W1$j$", and the plate surface opposite to the bonding surface W1$j$ will be referred to as "non-bonding surface W1$n$". Further, among plate surfaces of the lower wafer W2, the plate surface to be bonded to the upper wafer W1 will be referred to as "bonding surface W2$j$", and the plate surface opposite to the bonding surface W2$j$ will be referred to as "non-bonding surface W2$n$".

As depicted in FIG. 1, the bonding system 1 is equipped with a carry-in/out station 2 and a processing station 3. The carry-in/out station 2 and the processing station 3 are arranged in the order of the carry-in/out station 2 and the processing station 3 along the positive X-axis direction. In addition, the carry-in/out station 2 and the processing station 3 are connected as one body.

The carry-in/out station 2 includes a placing table 10 and a transfer section 20. The placing table 10 is equipped with a plurality of placing plates 11. Cassettes C1, C2, and C3 each of which accommodates therein a plurality of (for example, 25 sheets of) substrates horizontally are respectively placed on the placing plates 11. For example, the cassette C1 accommodates therein the upper wafer W1; the cassette C2, the lower wafer W2; and the cassette C3, the combined wafer T.

The transfer section 20 is provided adjacent to the positive X-axis side of the placing table 10. Provided in this transfer section 20 are a transfer path 21 extending in the Y-axis direction and a transfer device 22 configured to be movable along this transfer path 21.

The transfer device 22 is configured to be movable in the X-axis direction as well as in the Y-axis direction and pivotable around the Z-axis. The transfer device 22 transfers the upper wafer W1, the lower wafer W2, and the combined wafer T between the cassettes C1 to C3 placed on the placing plates 11 and the processing station 3 to be described later.

Further, the number of the cassettes C1 to C3 disposed on the placing plates 11 is not limited to the shown example. In addition to the cassettes C1, C2, and C3, a cassette for collecting a defective substrate or the like may also be disposed on the placing plate 11.

The processing station 3 includes a plurality of processing blocks, for example, three processing blocks G1, G2 and G3, equipped with various types of apparatuses. By way of example, the first processing block G1 is provided on the front side (negative Y-axis side of FIG. 1) of the processing station 3, and the second processing block G2 is provided on the rear side (positive Y-axis side of FIG. 1) of the processing station 3. Further, the third processing block G3 is provided on the carry-in/out station 2 side (negative X-axis side in FIG. 1) of the processing station 3.

Disposed in the first processing block G1 is a surface modifying apparatus 30 configured to modify the bonding surface W1$j$ of the upper wafer W1 and the bonding surface W2$j$ of the lower wafer W2 with plasma of a processing gas. The surface modifying apparatus 30 forms a dangling bond in the bonding surface W1$j$ of the upper wafer W1 and the bonding surface W2$j$ of the lower wafer W2, thus allowing the bonding surfaces W1$j$ and W2$j$ to be modified so that they are easily hydrophilized afterwards.

Further, in the surface modifying apparatus 30, a preset processing gas is excited into plasma under, for example, a decompressed atmosphere to be ionized. As ions of an element contained in this processing gas are radiated to the bonding surfaces W1$j$ and W2$j$ of the upper wafer W1 and the lower wafer W2, the bonding surfaces W1$j$ and W2$j$ are modified by being plasma-processed. Details of this surface modifying apparatus 30 will be described later.

Disposed in the second processing block G2 is a surface hydrophilizing apparatus 40 and a bonding apparatus 41. The surface hydrophilizing apparatus 40 is configured to hydrophilize and clean the bonding surfaces W1$j$ and W2$j$ of the upper wafer W1 and the lower wafer W2 with, for example, pure water.

In the surface hydrophilizing apparatus 40, the pure water is supplied onto the upper wafer W1 or the lower wafer W2 while rotating the upper wafer W1 or the lower wafer W2 held by, for example, a spin chuck. Accordingly, the pure water supplied onto the upper wafer W1 or the lower wafer W2 is diffused on the bonding surface W1$j$ of the upper wafer W1 or the bonding surface W2$j$ of the lower wafer W2, so that the bonding surfaces W1$j$ and W2$j$ are hydrophilized.

The bonding apparatus 41 is configured to bond the upper wafer W1 and the lower wafer W2. Details of this bonding apparatus 41 will be described later.

In the third processing block G3, transition (TRS) devices 50 and 51 for the upper wafer W1, the lower wafer W2, and the combined wafer T are sequentially arranged in two levels from the bottom, as illustrated in FIG. 2.

Further, as shown in FIG. 1, a transfer section 60 is formed in an area surrounded by the first processing block G1, the second processing block G2, and the third processing block G3. In the transfer section 60, a transfer device 61 is disposed. The transfer device 61 has a transfer arm configured to be movable in a vertical direction and a horizontal direction and pivotable around a vertical axis, for example.

This transfer device 61 is moved within the transfer section 60 to transfer the upper wafer W1, the lower wafer W2, and the combined wafer T to preset apparatuses within the first processing block G1, the second processing block G2, and the third processing block G3 adjacent to the transfer section 60.

Furthermore, the bonding system 1 is equipped with a control device 4. The control device 4 controls an operation of the bonding system 1. The control device 4 is, for example, a computer, and includes a controller 5 and a storage 6. The storage 6 stores therein a program for controlling various kinds of processings such as a bonding processing. The controller 5 controls the operation of the bonding system 1 by reading and executing the program stored in the storage 6.

In addition, this program may be recorded on a computer-readable recording medium and installed from the recording medium to the storage 6 of the control device 4. The computer-readable recording medium may be, by way of non-limiting example, a hard disk (HD), a flexible disk (FD), a compact disk (CD), a magnet optical disk (MO), a memory card, or the like.

<Configuration of Surface Modifying Apparatus>

Figure 4:
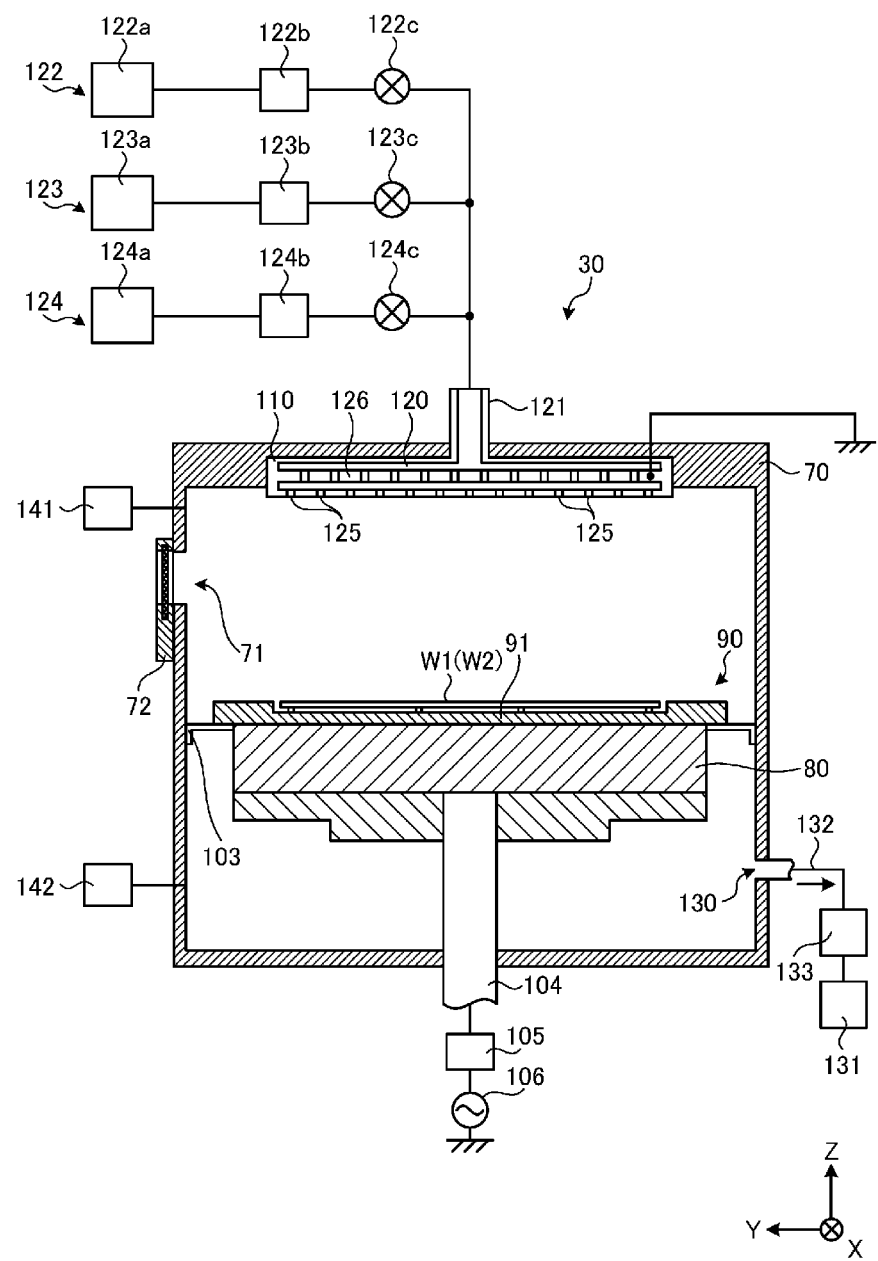
FIG. 4 is a schematic cross-sectional view illustrating a configuration of a surface modifying apparatus according to the exemplary embodiment.

Now, a configuration of the surface modifying apparatus 30 will be explained with reference to FIG. 4. FIG. 4 is a schematic cross-sectional view illustrating the configuration of the surface modifying apparatus 30 according to the exemplary embodiment.

As depicted in FIG. 4, the surface modifying apparatus 30 includes a processing vessel 70 having a hermetically sealable inside. A carry-in/out opening 71 for the upper wafer W1 or the lower wafer W2 is formed at a side surface of the processing vessel 70 on the transfer section 60 (see FIG. 1) side, and a gate valve 72 is provided at the carry-in/out opening 71.

A stage 80 is disposed inside the processing vessel 70. The stage 80 is, for example, a lower electrode, and is made of a conductive material such as, but not limited to, aluminum. The stage 80 is provided with non-illustrated through holes for pins, and non-illustrated lifter pins are accommodated in these through holes for pins. The lifter pins are configured to be movable up and down by an elevating mechanism not shown.

A top surface of the stage 80 is a circular horizontal surface having a larger diameter than the upper wafer W1 and the lower wafer W2, when viewed from the top. A stage cover 90 is disposed on the top surface of the stage 80, and the upper wafer W1 or the lower wafer W2 is placed on a placing portion 91 of the stage cover 90.

A ring-shaped partition plate 103 provided with a multiple number of baffle holes is disposed between the stage 80 and an inner wall of the processing vessel 70. The partition plate 103 is also referred to as an exhaust ring. This partition plate 103 partitions the internal space of the processing vessel 70 into an upper space and a lower space with the placing portion 91 as a boundary. The partition plate 103 allows an atmosphere within the processing vessel 70 to be uniformly exhausted from the inside of the processing vessel 70.

A power feed rod 104 formed of a conductor is connected to a bottom surface of the stage 80. The power feed rod 104 is connected to a first high frequency power supply 106 via a matching device 105 which is composed of, for example, a blocking capacitor or the like. When a plasma processing is performed, a preset high frequency voltage is applied to the stage 80 from the first high frequency power supply 106.

The upper electrode 110 is disposed within the processing vessel 70. The top surface of the stage 80 and a bottom surface of the upper electrode 110 are disposed to face each other in parallel with a certain distance therebetween. The distance between the top surface of the stage 80 and the bottom surface of the upper electrode 110 is adjusted by a driving unit 81.

The upper electrode 110 is grounded to be connected to the ground potential. Since the upper electrode 110 is grounded in this way, damage to the bottom surface of the upper electrode 110 can be suppressed during the plasma processing.

In this way, as the high frequency voltage is applied from the first high frequency power supply 106 to the stage 80 serving as the lower electrode, plasma is formed within the processing vessel 70.

In the exemplary embodiment, the stage 80, the power feed rod 104, the matching device 105, the first high frequency power supply 106 and the upper electrode 110 constitute an example of a plasma forming mechanism configured to form the plasma of the processing gas within the processing vessel 70. Moreover, the first high frequency power supply 106 is controlled by the controller 5 of the control device 4 described above.

A hollow space 120 is formed inside the upper electrode 110. A gas supply line 121 is connected to this hollow space 120. The gas supply line 121 is connected to a processing gas supply mechanism 122, an inert gas supply mechanism 123, and a humidified gas supply mechanism 124.

The processing gas supply mechanism 122 is configured to supply the processing gas to the hollow space 120 of the upper electrode 110 via the gas supply line 121. By way of non-limiting example, an oxygen gas, a nitrogen gas, an argon gas, or the like is used as the processing gas. The processing gas supply mechanism 122 includes a processing gas source 122a, a flow rate controller 122b, and a valve 122c. The processing gas supplied from the processing gas source 122a is supplied into the hollow space 120 of the upper electrode 110 via the gas supply line 121 with its flow rate adjusted by the flow rate controller 122b and the valve 122c. The processing gas supply mechanism 122 is an example of a first gas supply.

The inert gas supply mechanism 123 is configured to supply an inert gas to the hollow space 120 of the upper electrode 110 via the gas supply pipe 121. By way of non-limiting example, a nitrogen gas or an argon gas is used as the inert gas. The inert gas supply mechanism 123 has an inert gas source 123a, a flow rate controller 123b, and a valve 123c. The inert gas supplied from the inert gas source 123a is supplied into the hollow space 120 of the upper electrode 110 via the gas supply line 121 with its flow rate adjusted by the flow rate controller 123b and the valve 123c.

The humidified gas supply mechanism 124 is configured to supply a gas, which is humidified, (humidified gas) to the hollow space 120 of the upper electrode 110 via the gas supply line 121. By way of non-limiting example, a humidified nitrogen gas or a humidified argon gas is used as the humidified gas. Alternatively, air having adjusted temperature and humidity may be used as the humidified gas. The humidified gas supply mechanism 124 has a humidified gas source 124a, a flow rate controller 124b, and a valve 124c. The humidified gas supplied from the humidified gas source 124a is supplied into the hollow space 120 of the upper electrode 110 via the gas supply line 121 with its flow rate adjusted by the flow rate controller 124b and the valve 124c. The humidified gas supply mechanism 124 is an example of a second gas supply.

A baffle plate 126 is provided in the hollow space 120 to accelerate uniform diffusion of the processing gas, the inert gas and the humidified gas. The baffle plate 126 is provided with a number of small holes. A multiple number of gas discharge openings 125 are formed in a bottom surface of the upper electrode 110 to discharge the processing gas, the inert gas and the humidified gas from the hollow space 120 into the processing vessel 70.

The processing vessel 70 is provided with an intake port 130. Connected to the intake port 130 is an intake line 132 that communicates with a vacuum pump 131 configured to decompress the atmosphere within the processing vessel 70 to a preset vacuum level. The intake line 132 is equipped with an APC (Auto Pressure Controller) valve 133. As the inside of the processing vessel 70 is evacuated by the vacuum pump 131, the opening degree of the APC valve 133 is adjusted, so that the pressure inside the processing vessel 70 is maintained at a predetermined pressure.

The processing vessel 70 is equipped with a spectrophotometer 141 capable of measuring light emission data of wavelengths within the processing vessel 70. Specifically, the spectrophotometer 141 is mounted to the processing vessel 70 so as to be located above the placing portion 91 and below the gas discharge openings 125. The spectrophotometer 141 is, for example, an OES (Optical Emission Spectroscopy) sensor, and it measures a light emission state of the plasma formed in the processing vessel 70. The spectrophotometer 141 may be a self-bias type OES sensor capable of forming plasma in its own chamber and measuring a light emission state of that plasma. The spectrophotometer 141 acquires light emission data of the processing gas supplied into the processing vessel 70, and measures a peak value appearing at a specific wavelength of the light emission data. The spectrophotometer 141 outputs the data of the peak value appearing at the specific wavelength of the measured light emission data to the controller 5 of the control device 4. The spectrophotometer 141 is an example of a measuring unit.

In addition, the processing vessel 70 is further equipped with a mass spectrometer 142 capable of analyzing the atmosphere within the processing vessel 70 with respect to a mass number of a specific substance. Specifically, the mass spectrometer 142 is mounted to the processing vessel 70 so as to be located below the partition plate 103. The mass spectrometer 142 is, for example, a quadrupole mass spectrometer (QMS), and it measures an analysis value obtained by analyzing the atmosphere within the processing vessel 70 with respect to the mass number of the specific substance. The mass spectrometer 142 outputs data of the measured analysis value to the controller 5 of the control device 4. By disposing the mass spectrometer 142 below the partition plate 103, damage to the mass spectrometer 142 by the plasma can be suppressed. The mass spectrometer 142 is an example of the measuring unit.

<Configuration of Bonding Apparatus>

Figure 5:
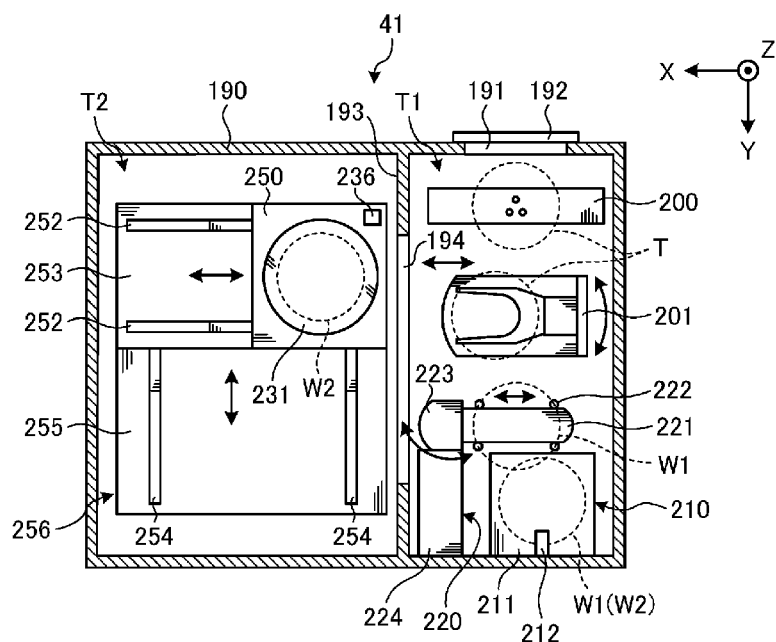
FIG. 5 is a schematic plan view illustrating a configuration of a bonding apparatus according to the exemplary embodiment.
Figure 6:
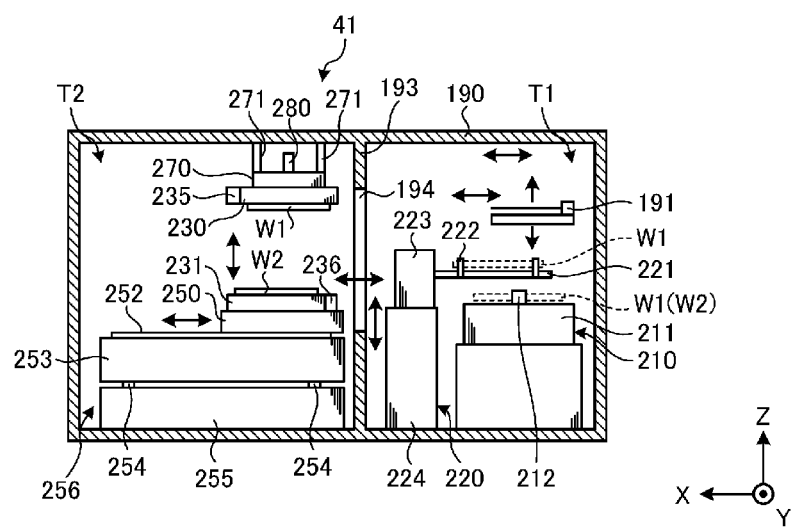
FIG. 6 is a schematic plan view illustrating the configuration of the bonding apparatus according to the exemplary embodiment.

Now, a configuration of the bonding apparatus 41 will be discussed with reference to FIG. 5 and FIG. 6. FIG. 5 is a schematic plan view illustrating the configuration of the bonding apparatus 41 according to the exemplary embodiment, and FIG. 6 is a schematic side view illustrating the configuration of the bonding apparatus 41 according to the exemplary embodiment.

As depicted in FIG. 5, the bonding apparatus 41 has a processing vessel 190 having a hermetically sealable inside. A carry-in/out opening 191 for the upper wafer W1, the lower wafer W2, and the combined wafer T is formed at a side surface of the processing vessel 190 on the transfer section 60 side, and an opening/closing shutter 192 is provided at the carry-in/out opening 191.

The inside of the processing vessel 190 is partitioned into a transfer section T1 and a processing section T2 by an inner wall 193. The aforementioned carry-in/out opening 191 is formed at the side surface of the processing vessel 190 in the transfer section T1. Further, the inner wall 193 is also provided with a carry-in/out opening 194 for the upper wafer W1, the lower wafer W2, and the combined wafer T.

In the transfer section T1, a transition device 200, a substrate transfer mechanism 201, an inverting mechanism 220, and a position adjusting mechanism 210 are arranged in this sequence from the carry-in/out opening 191 side, for example.

The transition device 200 temporarily places therein the upper wafer W1, the lower wafer W2, and the combined wafer T. The transition device 200 is formed in, for example, two levels and thus are capable of placing therein any two of the upper wafer W1, the lower wafer W2, and the combined wafer T at the same time.

The substrate transfer mechanism 201 has a transfer arm configured to be movable in a vertical direction (Z-axis direction) and horizontal directions (X-axis direction and Y-axis direction) and pivotable around a vertical axis (θ direction), for example. The substrate transfer mechanism 201 can transfer the upper wafer W1, the lower wafer W2, and the combined wafer T within the transfer section T1 or between the transfer section T1 and the processing section T2.

The position adjusting mechanism 210 is configured to adjust the directions of the upper wafer W1 and the lower wafer W2 in a horizontal direction. Specifically, the position adjusting mechanism 210 includes a base 211 provided with a holder (not shown) configured to hold and rotate the upper and lower wafers W1 and W2, and a detector 212 configured to detect the positions of notches of the upper wafer W1 and the lower wafer W2. By detecting the positions of the notches of the upper wafer W1 and the lower wafer W2 with the detector 212 while rotating the upper wafer W1 and the lower wafer W2 held by the base 211, the position adjusting mechanism 210 adjusts the positions of the notches. Accordingly, the directions of the upper wafer W1 and the lower wafer W2 in the horizontal direction are adjusted.

The inverting mechanism 220 is configured to invert the front and rear surfaces of the upper wafer W1. Specifically, the inverting mechanism 220 has a holding arm 221 configured to hold the upper wafer W1. The holding arm 221 extends in a horizontal direction (X-axis direction). Further, holding members 222 configured to hold the upper wafer W1 are provided at, for example, four positions on the holding arm 221.

The holding arm 221 is supported by a driving unit 223 equipped with, for example, a motor or the like. The holding arm 221 is rotatable around a horizontal axis by this driving unit 223. In addition, the holding arm 221 is also rotatable about the driving unit 223 and can move in a horizontal direction (X-axis direction). Below the driving unit 223, another driving unit (not shown) provided with, for example, a motor or the like is provided. The driving unit 223 can be moved in a vertical direction by this another driving unit along a supporting column 224 extending in the vertical direction.

In this way, the upper wafer W1 held by the holding members 222 can be rotated around the horizontal axis and can also be moved in the vertical and horizontal directions by the driving unit 223. Further, the upper wafer W1 held by the holding members 222 can be moved between the position adjusting mechanism 210 and an upper chuck 230 to be described later by being rotated about the driving unit 223.

In the processing section T2, there are provided the upper chuck 230 configured to attract and hold the top surface (non-bonding surface W1n) of the upper wafer W1 from above and a lower chuck 231 configured to attract and hold the bottom surface (non-bonding surface W2n) of the lower wafer W2 from below. The lower chuck 231 is disposed below the upper chuck 230, and faces the upper chuck 230. The upper chuck 230 and the lower chuck 231 are, for example, vacuum chucks.

As depicted in FIG. 6, the upper chuck 230 is supported by a supporting member 270 provided above the upper chuck 230. The supporting member 270 is fixed to a ceiling surface of the processing vessel 190 with, for example, a plurality of supporting columns 271 therebetween.

An upper imaging unit 235 configured to image the top surface (bonding surface W2j) of the lower wafer W2 held by the lower chuck 231 is disposed on a lateral side of the upper chuck 230. The upper imaging unit 235 is configured as, for example, a CCD camera.

The lower chuck 231 is supported by a first moving unit 250 disposed under the lower chuck 231. The first moving unit 250 moves the lower chuck 231 in a horizontal direction (X-axis direction) as will be described later. Further, the first moving unit 250 is configured to be able to move the lower chuck 231 in a vertical direction as well and to be able to be rotated around a vertical axis.

The first moving unit 250 is equipped with a lower imaging unit 236 configured to image the bottom surface (bonding surface W1j) of the first substrate W1 held by the upper chuck 230. The lower imaging unit 236 is configured as, for example, a CCD camera.

The first moving unit 250 is mounted to a pair of rails 252. The rails 252 are disposed on the bottom surface side of the first moving unit 250 and is elongated in a horizontal direction (X-axis direction). The first moving unit 250 is configured to be movable along these rails 252.

The pair of rails 252 are provided on a second moving unit 253. The second moving unit 253 is mounted to a pair of rails 254. The rails 254 are provided on the bottom surface side of the second driving unit 253, and is elongated in a horizontal direction (Y-axis direction). The second moving unit 253 is configured to be movable in the horizontal direction (Y-axis direction) along the rails 254. Further, the pair of rails 254 are disposed on a placing table 255 which is provided on a bottom surface of the processing vessel 190.

The first moving unit 250, the second moving unit 253, and the like constitute a position alignment unit 256. The position alignment unit 256 moves the lower chuck 231 in the X-axis direction, the Y-axis direction, and the θ direction, thus allowing the upper wafer W1 held by the upper chuck 230 and the lower wafer W2 held by the lower chuck 231 to be aligned with each other in a horizontal direction. In addition, the position alignment unit 256 moves the lower chuck 231 in the Z-axis direction as well, thus allowing the upper wafer W1 held by the upper chuck 230 and the lower wafer W2 held by the lower chuck 231 to be aligned with each other in a vertical direction.

Here, although the lower chuck 231 is moved in the X-axis direction, the Y-axis direction, and the θ direction, the position alignment unit 256 may move the lower chuck 231 in the X-axis direction and the Y-axis direction while moving the upper chuck 230 in the θ direction, for example. Further, although the lower chuck 231 is moved in the Z-axis direction here, the position alignment unit 256 may move the upper chuck 230 in the Z-axis direction, for example.

Figure 7:
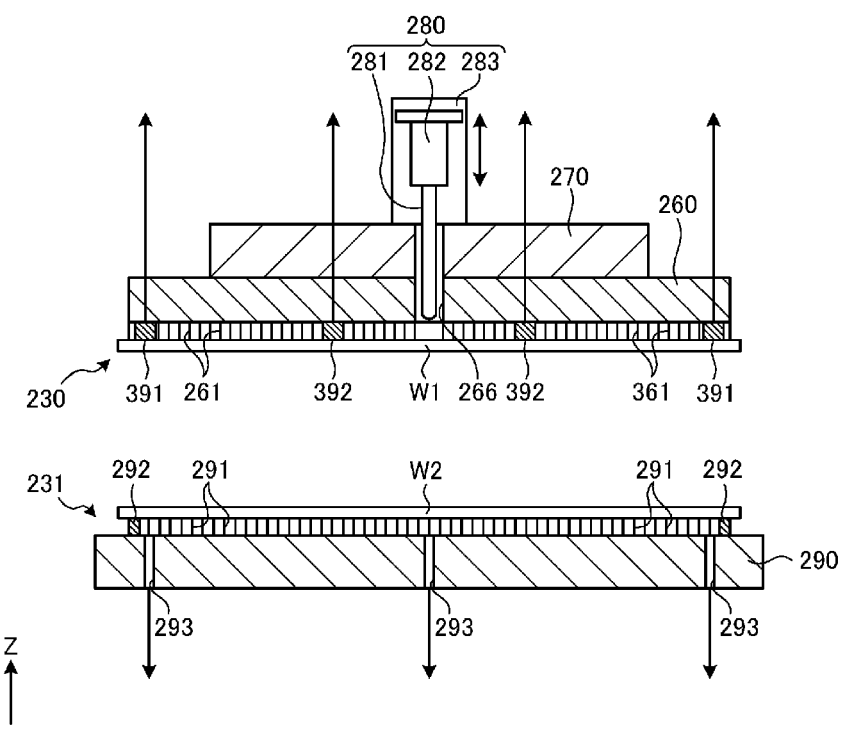
FIG. 7 is a schematic view illustrating an upper chuck and a lower chuck according to the exemplary embodiment.

Now, a configuration of the upper chuck 230 and the lower chuck 231 will be described with reference to FIG. 7. FIG. 7 is a schematic diagram illustrating the configuration of the upper chuck 230 and the lower chuck 231 according to the exemplary embodiment.

As shown in FIG. 7, the upper chuck 230 has a main body 260. The main body 260 is supported by a supporting member 270. A through hole 266 is formed through the supporting member 270 and the main body 260 in a vertical direction. The position of this through hole 266 corresponds to the center of the upper wafer W1 attracted to and held by the upper chuck 230. A pressing pin 281 of a striker 280 is inserted into the through hole 266.

The striker 280 is disposed on a top surface of the supporting member 270 and is equipped with the pressing pin 281, an actuator 282, and a linearly moving mechanism 283. The pressing pin 281 is a columnar member extending in the vertical direction and is supported by the actuator 282.

The actuator 282 is configured to generate a constant pressure in a certain direction (here, vertically downwards) by air supplied from, for example, an electro-pneumatic regulator (not shown). By the air supplied from the electro-pneumatic regulator, the actuator 282 is capable of coming into contact with a central portion of the upper wafer W1 and controlling a pressing load applied to the central portion of the upper wafer W1. Further, a leading end of the pressing pin 281 is movable up and down in the vertical direction through the through hole 266 by the air from the electro-pneumatic regulator.

The actuator 282 is supported by the linearly moving mechanism 283. The linearly moving mechanism 283 moves the actuator 282 along the vertical direction by a driving unit having, for example, a motor embedded therein.

The striker 280 is configured as described above, and controls the movement of the actuator 282 by the linearly moving mechanism 283 and controls the pressing load on the upper wafer W1 from the pressing pin 281 by the actuator 282. Accordingly, the striker 280 presses the central portion of the upper wafer W1 held by the upper chuck 230 to bring it into contact with the lower wafer W2.

A plurality of pins 261 to be brought into contact with the top surface (non-bonding surface W1n) of the upper wafer W1 is provided on a bottom surface of the main body 260. Each of these pins 261 has a diameter of, e.g., 0.1 mm to 1 mm and a height of several tens of μm to several hundreds of μm. The pins 261 are evenly arranged at a distance of, e.g., 2 mm.

The upper chuck 230 is provided with a plurality of attraction members configured to attract the upper wafer W1 in some of the regions where the plurality of pins 261 are provided. Specifically, on the bottom surface of the main body 260 of the upper chuck 230, a plurality of outer attraction members 391 and a plurality of inner attraction members 392 are provided to attract the upper wafer W1 by vacuum-evacuation. The plurality of outer attraction members 391 and the plurality of inner attraction members 392 have arc-shaped attraction regions when viewed from the top. The outer attraction members 391 and the inner attraction members 392 have the same height as the pins 261.

The plurality of outer attraction members 391 are disposed at an outer periphery of the main body 260. These outer attraction members 391 are connected to a non-illustrated suction device such as a vacuum pump, and attract an outer peripheral portion of the upper wafer W1 by the vacuum-evacuation.

The plurality of inner attraction members 392 are arranged along a circumferential direction of the main body 260 at a radially inner side than the outer attraction members 391. The plurality of inner attraction members 392 are connected to a non-illustrated suction device such as a vacuum pump, and attract a region between the outer periphery and the central portion of the upper wafer W1 by the vacuum-evacuation.

The lower chuck 231 has a main body 290 having a diameter equal to or larger than the diameter of the lower wafer W2. Here, the lower chuck 231 is illustrated as having a larger diameter than the lower wafer W2. A top surface of the main body 290 is a facing surface that faces the bottom surface (non-bonding surface W2n) of the lower wafer W2.

A plurality of pins 291 to be brought into contact with the bottom surface (non-bonding surface W2n) of the lower wafer W2 is provided on the top surface of the main body 290. The pins 291 have a diameter of, e.g., 0.1 mm to 1 mm and a height of several tens of μm to several hundreds of μm. The plurality of pins 291 are evenly arranged at a distance of, e.g., 2 mm.

Further, a lower rib 292 is annularly provided on the top surface of the main body 290 to be located outside the plurality of pins 291. The lower rib 292 is formed in an annular shape and supports the outer periphery of the lower wafer W2 over the entire circumference thereof.

The main body 290 has a plurality of lower suction ports 293. The plurality of lower suction ports 293 are provided in a suction region surrounded by the lower rib 292. These lower suction ports 293 are connected to a non-illustrated suction device such as a vacuum pump via a non-illustrated suction line.

The lower chuck 231 decompresses the suction region surrounded by the lower rib 292 by vacuum-evacuating the suction region through the plurality of lower suction ports 293. As a result, the lower wafer W2 disposed in the suction region is attracted to and held by the lower chuck 231.

Since the lower rib 292 supports the outer periphery of the bottom surface of the lower wafer W2 over the entire circumference thereof, the outer periphery of the lower wafer W2 is properly vacuum-evacuated. Thus, the entire surface of the lower wafer W2 can be attracted and held. In addition, since the bottom surface of the lower wafer W2 is supported by the plurality of pins 291, the lower wafer W2 can be easily separated from the lower chuck 231 when the vacuum-evacuation of the lower wafer W2 is released.

<Specific Operation of Bonding System>

Through intensive research, the inventors of the present application have found out that the amount of moisture in the processing vessel 70 in the surface modifying apparatus 30 and the bonding strength between the upper wafer W1 and the lower wafer W2 obtained when bonding the upper wafer W1 modified in the processing vessel 70 to the lower wafer W2 have a correlation.

For example, in the surface modifying apparatus 30, if the surface modification process is repeatedly performed in the processing vessel 70, the amount of moisture in the processing vessel 70 is gradually reduced due to the vacuum-evacuation or the like. If the amount of moisture in the processing vessel 70 decreases, the surface modification of the upper wafer W1 and the lower wafer W2 is not sufficiently carried out because the state of the plasma of the processing gas formed in the processing vessel 70 changes. It is assumed that this insufficient surface modification becomes a factor in reducing the bonding strength between the upper wafer W1 and the lower wafer W2.

As a resolution, in the bonding system 1 according to the exemplary embodiment, a value representing the amount of moisture in the processing vessel 70 is measured by using a measuring device such as the spectrophotometer 141 before a series of processes of the bonding processing are performed, and the quality of the bonding strength is determined based on the measured value representing the amount of moisture in the processing vessel 70.

Figure 8:
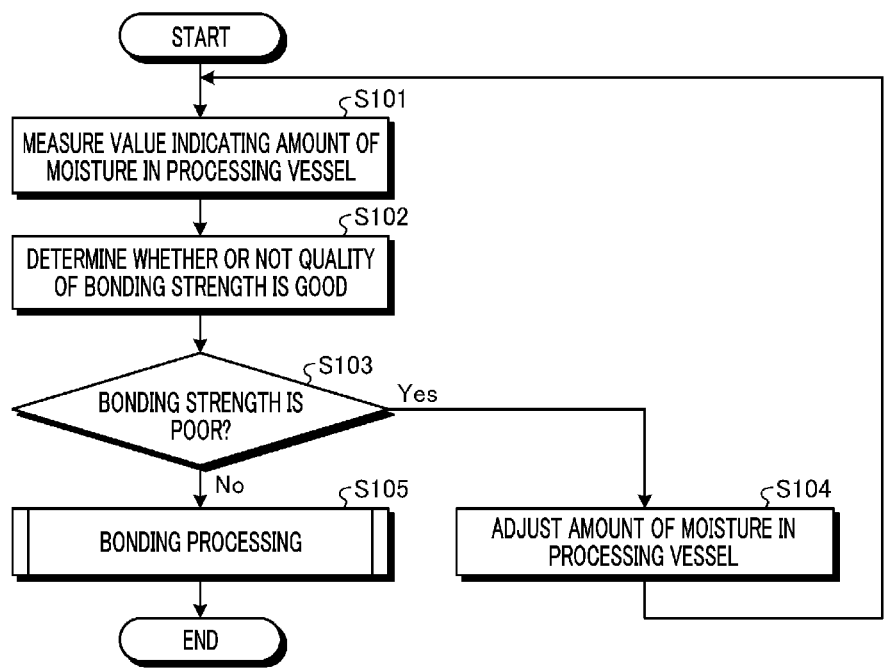
FIG. 8 is a flowchart illustrating a sequence of a processing performed by the bonding system according to the exemplary embodiment.

Hereinafter, a sequence of a bonding strength determination process performed by the bonding system 1 will be described with reference to FIG. 8. FIG. 8 is a flowchart showing a sequence of processes performed by the bonding system 1 according to the exemplary embodiment. The various processes shown in FIG. 8 are performed under the control of the controller 5 of the control device 4.

As depicted in FIG. 8, the controller 5 measures a value indicating the amount of moisture in the processing vessel 70 (process S101). For example, the controller 5 controls the spectrophotometer 141 and the processing gas supply mechanism 122 to acquire light emission data of the processing gas supplied into the processing vessel 70, and obtains a peak value appearing at a specific wavelength of the light emission data as the value indicating the amount of moisture in the processing vessel 70.

Further, the controller 5 may also control the mass spectrometer 142 to further measure, as the value indicating the amount of moisture in the processing vessel 70, an analysis value obtained by analyzing an atmosphere in the processing vessel 70 in terms of a mass number of water.

Subsequently, based on the measured value indicating the amount of moisture in the processing vessel 70, the controller 5 determines whether or not the quality of the bonding strength between the upper wafer W1 and the lower wafer W2 is good on the assumption that the upper wafer W1 modified in the processing vessel 70 is bonded to the lower wafer W2 (process S102).

Figure 9:
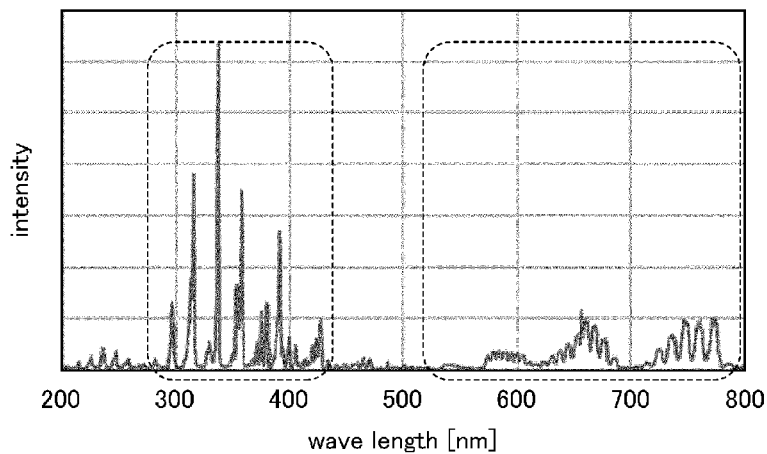
FIG. 9 is a diagram illustrating an example of a measurement result of an amount of moisture in a processing vessel.
Figure 10:
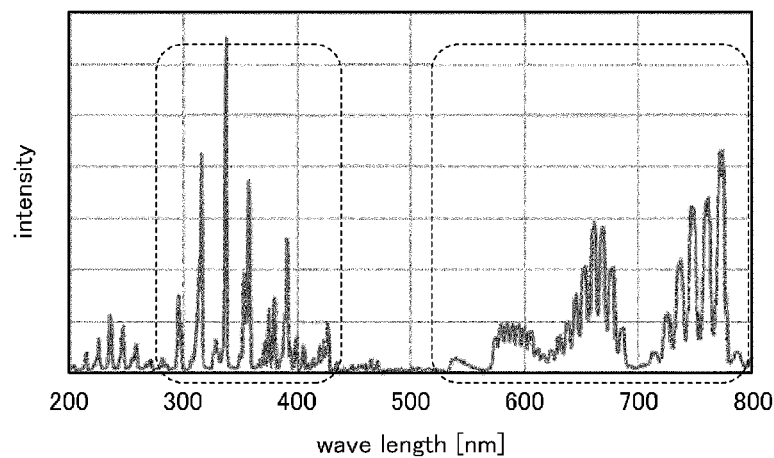
FIG. 10 is a diagram illustrating an example of the measurement result of the amount of moisture in a processing vessel.

Here, an example of determining the quality of the bonding strength based on the value indicating the amount of moisture in the processing vessel 70 will be described with reference to FIG. 9 and FIG. 10. FIG. 9 and FIG. 10 are diagrams showing examples of the measurement result of the amount of moisture in the processing vessel 70. FIG. 9 presents light emission data of wavelengths within the processing vessel 70 immediately after the processing vessel 70 is opened to the air during the maintenance. FIG. 9 shows the light emission data measured by the spectrophotometer 141 when the plasma of the nitrogen gas as the processing gas is formed in the processing vessel 70. The plasma of the nitrogen gas contains nitrogen ions of a first excitation level (first POS) and nitrogen ions of a second excitation level (second POS) having higher activity than the nitrogen ions of the first excitation level. The wavelength of the nitrogen ion of the first excitation level is within a range of about 530 nm to 800 nm, and the wavelength of the nitrogen ion of the second excitation level is within a range of about 280 nm to 440 nm. The light emission data shown in FIG. 9 indicate that almost no nitrogen ion of the first excitation level is generated when the processing vessel 70 is opened to the air during the maintenance. This is deemed to be because the nitrogen ions of the first excitation level are extinguished from the inside of the processing vessel 70 as the amount of moisture in the processing vessel 70 rises due to the opening to the air so that the energy of the nitrogen ions of the first excitation level is transferred to the moisture ($H_2O$) existing in the processing vessel 70.

FIG. 10 shows light emission data of wavelengths within the processing vessel 70 after the surface modification of the upper wafer W1 is repeatedly performed a predetermined number of times. FIG. 10 shows the light emission data measured by the spectrophotometer 141 when the plasma of the nitrogen gas as the processing gas is formed in the processing vessel 70. The light emission data shown in FIG. 10 indicate that the amount of the nitrogen ions of the first excitation level increases when the surface modification of the upper wafer W1 is repeatedly performed in the processing vessel 70. This is deemed to be because when the surface modification is performed repeatedly, the amount of moisture in the processing vessel 70 decreases due to the vacuum-evacuation or the like, so that the energy of the nitrogen ions of the first excitation level is difficult to transfer to the moisture ($H_2O$), which results in the increase of the remaining nitrogen ions of the first excitation level.

The controller 5 determines the quality of the bonding strength between the upper wafer W1 and the lower wafer W2 based on the peak value appearing at the wavelength corresponding to the nitrogen ions of the first excitation level of the light emission data measured by the spectrophotometer 141. As the amount of moisture in the processing vessel 70 decreases, the peak value appearing at the wavelength corresponding to the nitrogen ions of the first excitation level increases. Therefore, it can be determined from the peak value appearing at the wavelength corresponding to the nitrogen ions of the first excitation level whether or not the bonding strength between the upper wafer W1 and the lower wafer W2 is reduced below a normal range due to the decrease in the amount of moisture in the processing vessel 70. For example, the controller 5 determines whether the peak value at the wavelength corresponding to the nitrogen ions of the first excitation level measured by the spectrophotometer 141 is equal to or larger than a first threshold value. The first threshold value is set to a value at which the bonding strength between the upper wafer W1 and the lower wafer W2 can be regarded as being reduced below the normal range. By way of example, the first threshold value is a peak value arbitrarily selected from a plurality of peak values appearing when the bonding strength between the upper wafer W1 and the lower wafer W2 is within the normal range. When the peak value appearing at the wavelength corresponding to the nitrogen ions of the first excitation level measured by the spectrophotometer 141 is equal to or larger than the first threshold value, the controller 5 makes a determination that the bonding strength between the upper wafer W1 and the lower wafer W2 is reduced below the normal range and thus is defective. Meanwhile, when the peak value appearing at the wavelength corresponding to the nitrogen ions of the first excitation level measured by the spectrophotometer 141 is less than the first threshold value, the controller 5 makes a determination that the bonding strength between the upper wafer W1 and the lower wafer W2 falls within the normal range and is thus good.

In addition, when the analysis value obtained by analyzing the atmosphere in the processing vessel 70 in terms of the mass number of water is measured as the value indicating the amount of moisture in the processing vessel 70 by using the mass spectrometer 142, the controller 5 may determine the quality of the bonding strength by using this analysis value as well.

Figure 11:
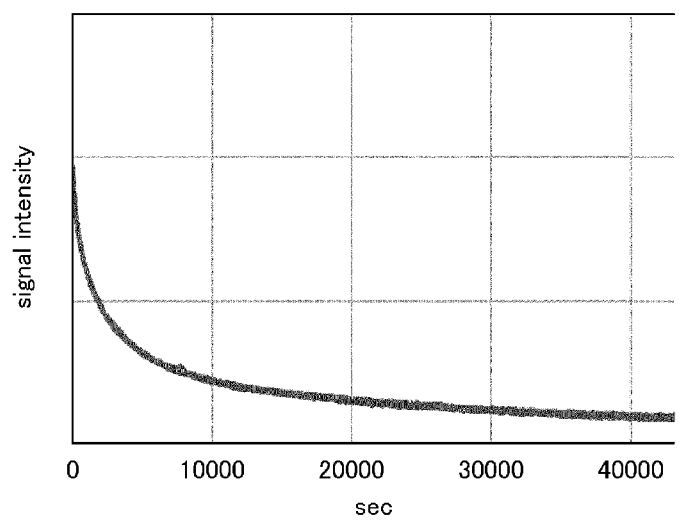
FIG. 11 is a diagram illustrating another example of the measurement result of the amount of moisture in the processing vessel.

FIG. 11 is a diagram showing another example of the measurement result of the amount of moisture in the processing vessel 70. FIG. 11 shows data of the analysis value obtained by analyzing the atmosphere in the processing vessel 70 in terms of the mass number (m/z=18) of water ($H_2O$) when the vacuum-evacuation is performed in the processing vessel 70 after the processing vessel 70 is opened to the air. FIG. 11 presents the data of the analysis value measured by the mass spectrometer 142. The data of the analysis value shown in FIG. 11 show that the amount of moisture in the processing vessel 70 gradually decreases due to the vacuum-evacuation when the surface modification of the upper wafer W1 is repeatedly performed in the processing vessel 70 a predetermined number of times.

Based on the peak value appearing at the wavelength corresponding to the nitrogen ions of the first excitation level of the light emission data measured by the spectrophotometer 141 and the analysis value measured by the mass spectrometer 142, the controller 5 determines whether or not the quality of the bonding strength between the upper wafer W1 and the lower wafer W2 is good. As the amount of moisture in the processing vessel 70 decreases, the analysis value decreases. Thus, it can be determined from the analysis value whether or not the bonding strength between the upper wafer W1 and the lower wafer W2 is reduced below the normal range due to the decrease in the amount of moisture in the processing vessel 70. For example, when the peak value at the wavelength corresponding to the nitrogen ions of the first excitation levels of the light emission data measured by the spectrophotometer 141 is less than the first threshold value, the controller 5 further determines whether the analysis value measured by the mass spectrometer 142 is equal to or less than a second threshold value. The second threshold value is set to a value at which the bonding strength between the upper wafer W1 and the lower wafer W2 can be regarded as being reduced below the normal range. By way of example, the second threshold value is an analysis value measured when the bonding strength between the upper wafer W1 and the lower wafer W2 falls within the normal range. When the analysis value measured by the mass spectrometer 142 is equal to or less than the second threshold value, the controller 5 makes a determination that the bonding strength between the upper wafer W1 and the lower wafer W2 is reduced below the normal range and is thus defective. On the other hand, when the analysis value measured by the mass spectrometer 142 is larger than the second threshold value, the controller 5 makes a determination that the bonding strength between the upper wafer W1 and the lower wafer W2 falls within the normal range and is thus good. In this way, the controller 5 is capable of determining the quality of the bonding strength with higher accuracy by using both the measurement result by the spectrophotometer 141 and the measurement result by the mass spectrometer 142.

Reference is made back to FIG. 8. When it is determined that the bonding strength between the upper wafer W1 and the lower wafer W2 is poor (process S103; Yes), the controller 5 adjusts the amount of moisture in the processing vessel 70 by supplying the humidified gas into the processing vessel 70 from the humidified gas supply mechanism 124 (process S104). In this way, the controller 5 is capable of suppressing the decrease in the bonding strength due to the decrease in the amount of moisture in the processing vessel 70 before performing the series of processes of the bonding processing. Thereafter, the controller 5 repeats the processes S101 to S104 until the bonding strength becomes good enough.

Figure 12:
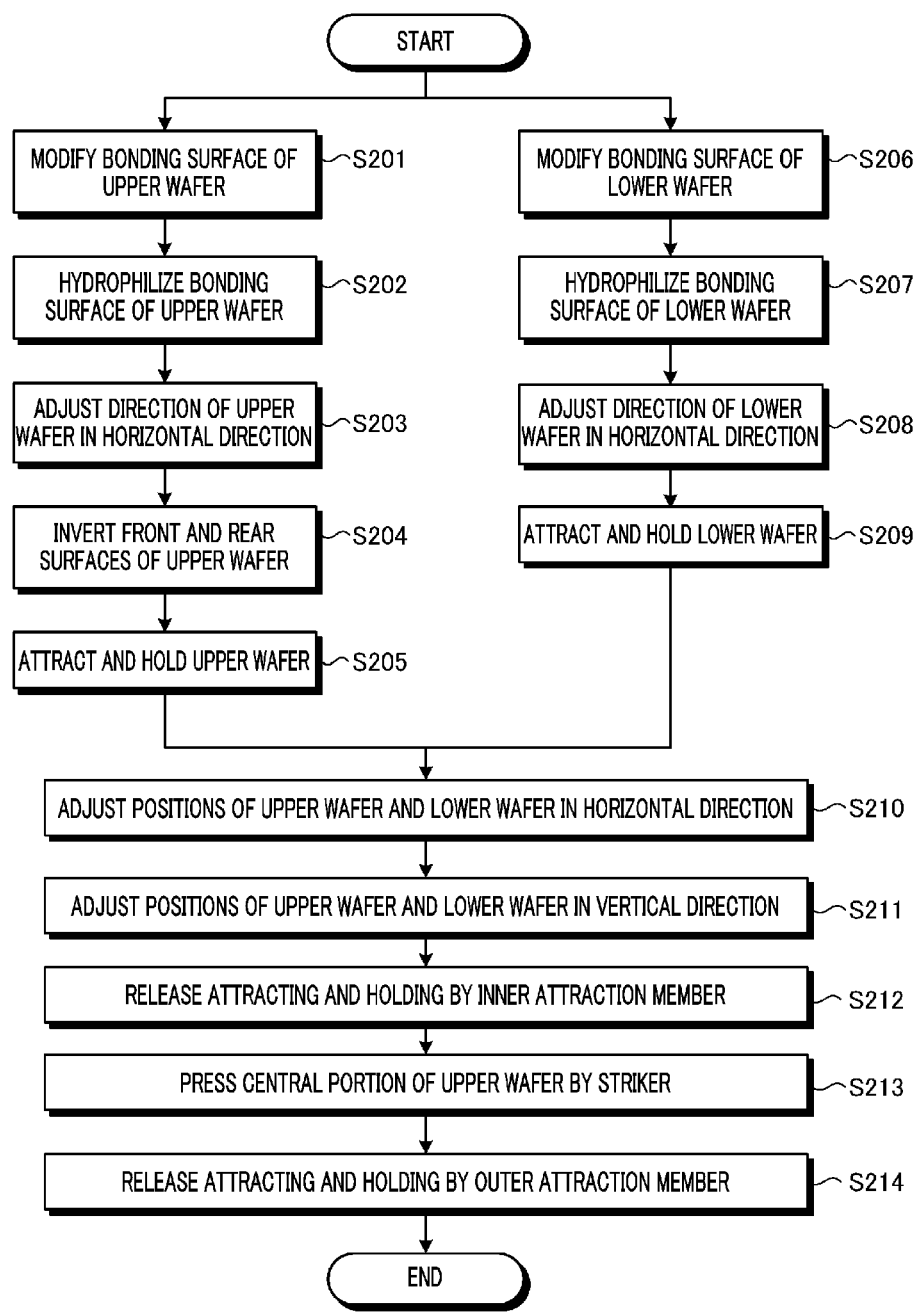
FIG. 12 is a flowchart illustrating a sequence of a bonding process according to the exemplary embodiment.

When it is determined by the controller 5 that the bonding strength between the upper wafer W1 and the lower wafer W2 is good (process S103; No), the bonding processing is performed in the bonding system 1 (process S105). Here, a sequence of the bonding processing will be described with reference to FIG. 12. FIG. 12 is a flowchart showing the sequence of the bonding processing according to the exemplary embodiment.

First, the cassette C1 accommodating therein the upper wafers W1, the cassette C2 accommodating therein the lower wafers W2, and the empty cassette C3 are placed on the preset placing plates 11 of the carry-in/out station 2. Then, the upper wafer W1 is taken out of the cassette C1 by the transfer device 22 and transferred to the transition device 50 of the third processing block G3.

Thereafter, the upper wafer W1 is transferred to the surface modifying apparatus 30 of the first processing block G1 by the transfer device 61. In the surface modifying apparatus 30, the nitrogen gas as the processing gas is excited into plasma under a preset decompressed atmosphere to be ionized. The nitrogen ions thus generated are radiated to the bonding surface W1j of the upper wafer W1, so that the bonding surface W1j is plasma-processed. Accordingly, the bonding surface W1j of the upper wafer W1 is modified (process S201).

Subsequently, the upper wafer W1 is transferred to the surface hydrophilizing apparatus 40 of the first processing block G1 by the transfer device 61. In the surface hydrophilizing apparatus 40, while rotating the upper wafer W1 held by the spin chuck, pure water is supplied onto the upper wafer W1. As a result, the bonding surface W1j of the upper wafer W1 is hydrophilized, and also cleaned by the pure water (process S202).

Next, the upper wafer W1 is transferred to the bonding apparatus 41 of the second processing block G2 by the transfer device 61. The wafer W1 carried into the bonding apparatus 41 is transferred to the position adjusting mechanism 210 via the transition device 200, and the direction of the upper wafer W1 in the horizontal direction is adjusted by the position adjusting mechanism 210 (process S203).

Thereafter, the upper wafer W1 is delivered from the position adjusting mechanism 210 to the inverting mechanism 220, and the front and rear surfaces of the upper wafer W1 are inverted by the inverting mechanism 220 (process S204). To be specific, the bonding surface W1j of the upper wafer W1 is turned to face downwards.

Subsequently, the upper wafer W1 is sent from the inverting mechanism 220 to the upper chuck 230 to be attracted to and held by the upper chuck 230 (process S205).

In parallel with the processes S101 to S105 upon the upper wafer W1, the lower wafer W2 is also processed. First, the lower wafer W2 is taken out of the cassette C2 by the transfer device 22, and transferred to the transition device 50 of the third processing block G3.

Next, the lower wafer W2 is transferred to the surface modifying apparatus 30 by the transfer device 61, and the bonding surface W2j of the lower wafer W2 is modified (process S206). The modification of the bonding surface W2j of the lower wafer W2 in the process S206 is the same as the above-described process S201.

Thereafter, the lower wafer W2 is transferred to the surface hydrophilizing apparatus 40 by the transfer device 61, and the bonding surface W2j of the lower wafer W2 is hydrophilized and cleaned (process S207). The hydrophilization and the cleaning of the bonding surface W2j of the lower wafer W2 in the process S207 is the same as the above-described process S202.

Afterwards, the lower wafer W2 is transferred to the bonding apparatus 41 by the transfer device 61. The lower wafer W2 carried into the bonding apparatus 41 is transferred to the position adjusting mechanism 210 via the transition device 200. Then, the direction of the lower wafer W2 in the horizontal direction is adjusted by the position adjusting mechanism 210 (process S208).

Thereafter, the lower wafer W2 is transferred to the lower chuck 231, and is attracted to and held by the lower chuck 231 with the notch thereof directed toward a predetermined direction (process S209).

Subsequently, the position alignment of the upper wafer W1 held by the upper chuck 230 and the lower wafer W2 held by the lower chuck 231 in the horizontal direction is carried out (process S210).

Next, the position alignment of the upper wafer W1 held by the upper chuck 230 and the lower wafer W2 held by the lower chuck 231 in the vertical direction are carried out (process S211). Specifically, the first moving unit 250 moves the lower chuck 231 vertically upwards, thus bringing the lower wafer W2 closer to the upper wafer W1.

Next, after the attracting and holding of the upper wafer W1 by the plurality of inner attraction members 392 is released (process S212), the pressing pin 281 of the striker 280 is lowered to press the central portion of the upper wafer W1 (process S213).

When the central portion of the upper wafer W1 comes into contact with the central portion of the lower wafer W2 and the central portion of the upper wafer W1 and the central portion of the lower wafer W2 are pressed by the striker 280 with a preset force, the bonding is started between the pressed central portions of the upper wafer W1 and the lower wafer W2. Specifically, since the bonding surface W1j of the upper wafer W1 and the bonding surface W2j of the lower wafer W2 are modified, a van der Waals force (intermolecular force) is first generated between the bonding surfaces W1j and W2j, so that the bonding surfaces W1j and W2j are bonded to each other. Further, since the bonding surface W1j of the upper wafer W1 and the bonding surface W2j of the lower wafer W2 are hydrophilized, hydrophilic groups between the bonding surfaces W1j and W2j are hydrogen-bonded, so that the bonding surfaces W1j and W2j are firmly bonded to each other. In this way, a bonding region is formed.

Afterwards, a bonding wave occurs between the upper wafer W1 and the lower wafer W2, so that the bonding region expands from the central portions of the upper wafer W1 and the lower wafer W2 to the outer peripheries thereof. Thereafter, the attracting and holding of the upper wafer W1 by the plurality of outer attraction members 391 is released (process S214). Accordingly, the outer periphery of the upper wafer W1 attracted to and held by the outer attraction members 391 fall down. As a result, the entire bonding surface W1j of the upper wafer W1 and the entire bonding surface W2j of the lower wafer W2 come into contact with each other, so that the combined wafer T is formed.

Then, the pressing pin 281 is raised up to the upper chuck 230, and the attracting and holding of the lower wafer W2 by the lower chuck 231 is released. Thereafter, the combined wafer T is carried out from the bonding apparatus 41 by the transfer device 61. In this way, the series of processes of the bonding processing are ended.

<Effects>

A surface modifying apparatus (for example, the surface modifying apparatus 30) according to the exemplary embodiment is an apparatus configured to modify a bonding surface (for example, the bonding surface W1j) of a substrate (for example, the upper wafer W1) to be bonded to another substrate (for example, the lower wafer W2) by plasma of a processing gas. The surface modifying apparatus includes a processing vessel (for example, the processing vessel 70), a measuring unit (for example, the spectrophotometer 141 and the mass spectrometer 142), and a controller (for example, the controller 5) configured to control the individual components of the surface modifying apparatus. The processing vessel is configured to accommodate the substrates therein. The measuring unit is configured to measure a value indicating an amount of moisture in the processing vessel. Based on the value indicating the amount of moisture in the processing vessel measured by the measuring unit, the controller determines whether or not the quality of bonding strength between the substrate and the another substrate, when it is assumed that the substrate modified in the processing vessel is bonded to the another substrate, is good. As a result, it is possible to determine the quality of the bonding strength between the substrates to be bonded before they are bonded.

In addition, the measuring unit (for example, the spectrophotometer 141) may acquire light emission data of the processing gas supplied into the processing vessel, and may measure a peak value appearing at a specific wavelength of the light emission data as the value indicating the amount of moisture in the processing vessel. The controller may determine whether or not the bonding strength is good based on the peak value appearing at the specific wavelength of the light emission data measured by the measuring unit. Therefore, it is possible to determine the quality of the bonding strength with high accuracy from, for example, a peak value appearing at a wavelength corresponding to a nitrogen ion of a first excitation level of the light emission data.

Further, the surface modifying apparatus according to the exemplary embodiment may be equipped with a plurality of measuring units. The plurality of measuring units may include a first measuring unit (for example, the spectrophotometer 141) and a second measuring unit (for example, the mass spectrometer 142). The first measuring unit may acquire the light emission data of the processing gas supplied into the processing vessel, and may measure the peak value appearing at the specific wavelength of the light emission data as the value indicating the amount of moisture in the processing vessel. The second measuring unit may further measure, as the value indicating the amount of moisture in the processing vessel, an analysis value obtained by analyzing an atmosphere in the processing vessel in terms of a mass number of water. The controller may determine whether or not the bonding strength is good based on the peak value appearing at the specific wavelength of the light emission data measured by the first measuring unit and the analysis value measured by the second measuring unit. Thus, since both the measurement result of the first measuring unit and the measurement result of the second measuring unit are used, the quality of the bonding strength can be determined with higher accuracy.

Moreover, the surface modifying apparatus according to the exemplary embodiment may further include a humidified gas supply (for example, the humidified gas supply mechanism 124) configured to supply a humidified gas into the processing vessel. When it is determined that the bonding strength is poor, the controller may adjust the amount of moisture in the processing vessel by supplying the humidified gas from the humidified gas supply into the processing vessel. Thus, before the substrates are bonded, it is possible to suppress the decrease in the bonding strength therebetween that might be caused by the decrease in the amount of moisture in the processing vessel.

It should be noted that the above-described exemplary embodiment is illustrative in all aspects and is not anyway limiting. The above-described exemplary embodiment may be omitted, replaced and modified in various ways without departing from the scope and the spirit of claims.

By way of example, the exemplary embodiment has been described for the case where the humidified gas is supplied into the processing vessel 70 by operating the humidified gas supply mechanism 124. However, the present disclosure is not limited thereto. For example, by opening the processing vessel 70 to the air, a moisture-containing gas in the air may be supplied into the processing vessel 70 as the humidified gas.

According to the exemplary embodiments, it is possible to determine the quality of the bonding strength between the substrates before the substrates are bonded.

We claim:

1. A surface modifying apparatus configured to modify a bonding surface of a substrate to be bonded to another substrate by plasma of a processing gas, the surface modifying apparatus comprising:
 a processing vessel accommodating the substrate therein;
 a measuring unit configured to measure a value indicating an amount of moisture in the processing vessel; and
 a controller configured to control individual components,
 wherein the controller determines whether or not bonding strength between the substrate and the another substrate, when it is assumed that the substrate modified in the processing vessel is bonded to the another substrate, is good based on the value indicating the amount of moisture in the processing vessel measured by the measuring unit,
 the measuring unit acquires light emission data of the processing gas supplied into the processing vessel, and measures a peak value appearing at a specific wavelength of the light emission data as the value indicating the amount of moisture in the processing vessel, and
 the controller determines whether or not the bonding strength is good based on the peak value appearing at the specific wavelength of the light emission data acquired by the measuring unit.

2. The surface modifying apparatus of claim 1,
 wherein the processing vessel is provided with a placing portion on which the substrate is placed and a gas discharge opening which is provided above the placing portion and through which the processing gas is discharged into the processing vessel, and
 the measuring unit is disposed above the placing portion and below the gas discharge opening.

3. The surface modifying apparatus of claim 1, further comprising:
 a humidified gas supply configured to supply a humidified gas into the processing vessel,
 wherein the controller adjusts the amount of moisture in the processing vessel by supplying the humidified gas into the processing vessel from the humidified gas supply when it is determined that the bonding strength is poor.

4. A surface modifying apparatus configured to modify a bonding surface of a substrate to be bonded to another substrate by plasma of a processing gas, the surface modifying apparatus comprising:
 a processing vessel accommodating the substrate therein;
 a measuring unit configured to measure a value indicating an amount of moisture in the processing vessel; and
 a controller configured to control individual components,
 wherein the controller determines whether or not bonding strength between the substrate and the another substrate, when it is assumed that the substrate modified in the processing vessel is bonded to the another substrate, is good based on the value indicating the amount of moisture in the processing vessel measured by the measuring unit,
 the measuring unit comprises multiple measuring units,
 the multiple measuring units comprises:
 a first measuring unit configured to acquire light emission data of the processing gas supplied into the processing vessel and measure a peak value appearing at a specific wavelength of the light emission data as the value indicating the amount of moisture in the processing vessel; and
 a second measuring unit configured to further measure, as the value indicating the amount of moisture in the processing vessel, an analysis value obtained by analyzing an atmosphere in the processing vessel in terms of a mass number of water, and
 wherein the controller determines whether or not the bonding strength is good based on the peak value appearing at the specific wavelength of the light emission data measured by the first measuring unit and the analysis value measured by the second measuring unit.

5. The surface modifying apparatus of claim 4,
wherein the processing vessel is provided with a placing portion on which the substrate is placed, a gas discharge opening which is disposed above the placing portion and through which the processing gas is discharged into the processing vessel, and a partition plate that partitions an internal space of the processing vessel into an upper space and a lower space with the placing portion as a boundary,
the first measuring unit is disposed above the placing portion and below the gas discharge opening, and
the second measuring unit is disposed below the partition plate.

6. A bonding strength determination method, comprising:
(a) measuring a value indicating an amount of moisture in a processing vessel accommodating a substrate therein within a surface modifying apparatus configured to modify a bonding surface of the substrate to be bonded to another substrate by plasma of a processing gas, and
(b) determining whether or not bonding strength between the substrate and the another substrate, when it is assumed that the substrate modified in the processing vessel is bonded to the another substrate, is good based on the value indicating the amount of moisture in the processing vessel,
wherein, in (a), light emission data of the processing gas supplied into the processing vessel is acquired and a peak value appearing at a specific wavelength of the light emission data is measured as the value indicating the amount of moisture in the processing vessel, and
in (b), it is determined whether or not the bonding strength is good based on the peak value appearing at the specific wavelength of the light emission data.

7. A bonding strength determination method, comprising:
(a) measuring a value indicating an amount of moisture in a processing vessel accommodating a substrate therein within a surface modifying apparatus configured to modify a bonding surface of the substrate to be bonded to another substrate by plasma of a processing gas; and
(b) determining whether or not bonding strength between the substrate and the another substrate, when it is assumed that the substrate modified in the processing vessel is bonded to the another substrate, is good based on the value indicating the amount of moisture in the processing vessel,
wherein (a) comprises:
a first measurement process of acquiring light emission data of the processing gas supplied into the processing vessel and measuring a peak value appearing at a specific wavelength of the light emission data as the value indicating the amount of moisture in the processing vessel; and
a second measurement process of further measuring, as the value indicating the amount of moisture in the processing vessel, an analysis value obtained by analyzing an atmosphere in the processing vessel in terms of a mass number of water, and
wherein, in (b), it is determined whether or not the bonding strength is good based on the peak value appearing at the specific wavelength of the light emission data measured by the first measuring unit and the analysis value measured by the second measuring unit.

* * * * *